United States Patent [19]

Wells et al.

[11] 4,165,481

[45] Aug. 21, 1979

[54] VERSATILE IGNITION DEFEAT AND SIGNAL CONDITIONING

[75] Inventors: John C. Wells, Colchester; Paul R. Back, Somersville, both of Conn.

[73] Assignee: United Technologies Corporation, Hartford, Conn.

[21] Appl. No.: 833,631

[22] Filed: Sep. 15, 1977

[51] Int. Cl.$^2$ .................................... G01M 15/00
[52] U.S. Cl. .................... 324/16 T; 324/16 R
[58] Field of Search .................... 324/16 T, 16 R

[56] References Cited

U.S. PATENT DOCUMENTS

| 3,763,420 | 10/1973 | Maisonville | 324/16 T |
| 3,767,902 | 10/1973 | Estes et al. | 324/16 T |
| 3,775,672 | 11/1973 | Letosky | 324/16 T |
| 3,946,305 | 3/1976 | Hasbrouck et al. | 324/16 R |
| 3,946,306 | 3/1976 | Hasbrouck | 325/16 R |
| 3,968,425 | 7/1976 | Hanson et al. | 324/16 T |
| 3,986,009 | 10/1976 | Fastaia | 324/16 R |

Primary Examiner—Charles J. Myhre
Assistant Examiner—R. A. Nelli
Attorney, Agent, or Firm—M. P. Williams

[57] ABSTRACT

The voltage across the primary of the ignition coil of a spark ignition engine is limited so as to defeat ignition, while at the same time allowing measurement of ignition-related signals, by means of unilateral impedance means which are selectively connected by a switch in parallel with the ignition coil primary, to service engines both with and without series impedance in the low coil signal line. To avoid reversed-polarity connection, the switch is operable only if the average voltage between high coil and low coil connections indicate correct polarity. Sensing of high coil and low coil signals indicative of firing time and dwell is achieved by monitoring current flow through the unilateral ignition defeat impedance, by means of an optical isolator resistively coupled across the unilateral impedance; current in the optical isolator is limited by means of a shunt transistor, and the optical isolator is protected against high voltages by an additional unilateral impedance. The ignition defeat and current-responsive sensing of the end of the dwell period is utilized with other signal conditioning circuitry to provide signals delineating firing time and dwell.

7 Claims, 3 Drawing Figures

VERSATILE IGNITION DEFEAT AND SIGNAL CONDITIONING

CROSS REFERENCE TO RELATED APPLICATIONS

Portions of the matter disclosed herein are disclosed and claimed in commonly owned copending applications of Back, et al Ser. No. 829,857 filed on Sept. 1, 1977, now U.S. Pat. No. 4,112,351, and entitled DUAL THRESHOLD LOW COIL SIGNAL CONDITIONER; and Van Vessem, et al, Ser. No. 833,633 filed on Sept. 15, 1977, now U.S. Pat. No. 4,112,350, and entitled NEGATIVE AND POSITIVE SWITCHING IGNITION SIGNAL CONDITIONER.

BACKGROUND OF THE INVENTION

1. Field of Art

This invention relates to spark ignition diagnostics, and more particularly to versatile ignition defeat and sensing of signals indicative of the firing time and dwell thereof.

2. Description of the Prior Art

In the aforementioned copending applications, there is disclosed and claimed apparatus for sensing low coil signals and high coil signals respectively related to the grounded and ungrounded end of the primary of the ignition coil of a spark ignition engine, to provide a signal which accurately delineates, without noise, the firing time and dwell period of the ignition cycles of the engine. One of the features of the apparatus disclosed and claimed in the aforementioned copending application is the ability to provide a conditioned signal delineating firing time from the dwell period, whether the related engine is being operated in an ignition defeated mode or in a full ignition mode. Many modern engines are provided with electronic switching modules in place of the previously-conventional, cam-operated breaker points shunted with a condenser, for the purpose of interrupting current through the coil primary, thus to induce the high voltage spark. Some of these systems include a protective resistance in series with the low coil signal line, whereas other such systems do not. In the past, ignition defeat has typically been made by connecting resistance, on the order of five ohms, in parallel across the coil primary when ignition defeat is desired. This is sufficient to limit the primary voltage to an extent that the high voltage of the coil secondary will be sufficient to cause an igniting spark in the spark plugs, yet, permit sensing the timing of the operation of the ignition system by monitoring signals on the high coil and/or low coil lines. But when there is a resistance (typically on the order of seven ohms) in series with the low coil line, the use of a typical ignition defeat would provide a total of twelve ohms across the primary, which allows more than the desired voltage to build up, so that ignition is sporadically observed while defeat is desired. The systems having seven ohms in series with the low coil line can be defeated by simply short circuiting high coil to low coil without doing any damage. But the systems without that resistance cannot be shorted from high coil to low coil without short circuiting the ungrounded end of the battery directly through either the breaker points or the electric switching module, which can cause great damage; and, naturally, there would be no signals to sense so as to delineate and measure the dwell and firing times. Thus, two different types of ignition defeat are required if various types of the newer and more conventional systems are to be accommodated for electronic sensing of timing of the ignition system while cranking with the ignition defeated. However, this requires an analysis of the particular type of engine under test and selectively providing either a dead short between high coil and low coil for those systems which have a series resistance built in or providing a shunting resistance between high coil and low coil for those systems which do not have a resistance built in. This hampers the operability of diagnostic systems which should be connectable to vehicles for diagnosis without undue modifications as a function of the particular type of engine under test.

SUMMARY OF THE INVENTION

Objects of the present invention include provision of a versatile ignition defeat which is useful in systems with and without series resistance in the coil signal lines, without knowledge of or alterations to accommodate which type of system is under test; apparatus for sensing signal conditions at the spark ignition coil while the ignition is defeated, in either of said systems, without knowledge or accommodation thereof; and provision of such apparatus which is operative only as suitably polarized with respect to the vehicle under test.

According to the present invention, ignition defeat, suitable for systems with or without series resistance in the coil primary signal lines, is effected by means of unilateral impedances which provide ignition-defeating primary coil voltage limitation without permitting short circuiting of the system. According further to the invention, the unilateral impedance is connected between high and low coil by a switch which is operable only after determining that the high coil and low coil signals have a proper polarity with respect to each other; in accordance further with this aspect of the invention the polarity between high and low coil is sensed by comparing the limited and averaged voltage of high coil to that of low coil to determine that the high coil is of proper polarity with respect to low coil. In accordance still further with the invention, the end of dwell period during ignition defeat is sensed by effectively sensing the current through the unilateral impedance shunted across the coil primary to cause ignition defeat; according further to this aspect of the invention, current sensing across the ignition-defeating unilateral impedance is achieved by means of an optical isolator protected by a current limiting transistor.

One of the features of the present invention is that it is usable with the ignition signal conditioning circuitry disclosed and claimed in the aforementioned copending applications, so as to provide, in composite, apparatus which will sense the dwell and firing time periods when the ignition is defeated and when it is undefeated, in systems with or without series resistance in the high coil or low coil signal lines, in systems using conventional breaker points or modern electronic switching of the coil primary, and in systems which are positively switched as well as systems which are negatively switched, without regard to which particular system is being tested.

The foregoing and other objects, features and advantages of the present invention will become more apparent in light of the following detailed description of exemplary embodiments thereof, as illustrated in the accompanying drawing.

DETAILED DESCRIPTION

Figure 1:
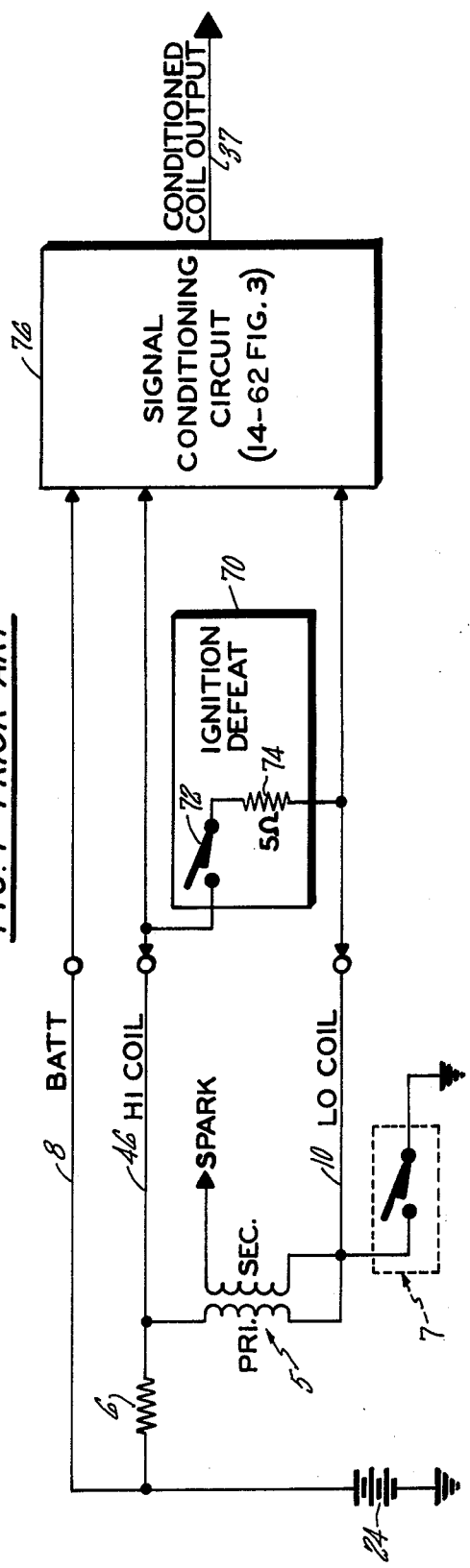
FIG. 1 is a simplified schematic block diagram of a conventional ignition system connected with conventional ignition defeat and signal conditioning circuitry in accordance with the prior art.

Referring now to FIG. 1, a typical ignition system known to the prior art includes a high voltage transformer usually referred to as an ignition coil 5 which has a primary and a secondary, the primary being connected at one end (referred to herein as "high coil") through a current limiting resistor 6 to the ungrounded end of the battery 24. To create a spark-producing high voltage in the secondary, the other end of the primary (referred to herein as "low coil") is periodically connected to ground by a switching means 7 to allow current to build up in the primary for a period of time referred to as the dwell period. Then, when the switching means 7 opens the circuit to ground, the collapsing magnetic field tries to maintain the current in the coil, and as a consequence induces a high voltage in the secondary, the current being dissipated by means of the spark in the spark plug currently connected through the distributor to the secondary, all as is known in the art. The switching means 7 has traditionally consisted of cam-actuated breaker points shunted with a condenser to prevent arcing across the points; more recently, however, the switching means 7 typically comprises solid state (transistor) switching circuitry.

In the performance of certain tests, it is desirable to crank the engine while measuring conditions in the ignition system, without allowing the engine to operate. Therefore, it has been known to provide ignition defeat circuitry 70 which selectively, by means of a suitable switch 72, connects a resistance 74, which is typically on the order of five ohms, directly across the coil primary by interconnection between the low coil signal line 10 and the high coil signal line 46. The voltage in the primary at the time that the switch means 7 opens is therefore limited to the current which has been established therein times the total resistance in the closed circuit loop including the resistance of the primary of the coil 5 and the resistance of the defeat resistor 74. Since the primaries typically achieve six or seven amps of current during the dwell period, a five ohm defeat resistance will limit the primary voltage to on the order of 35 volts, and effectively limit the secondary voltage to on the order of several kilovolts, rather than the tens to kilovolts required for effective ignition. For engine diagnostics, it has been known to employ signal conditioning circuitry 76 to respond to signals on the low coil signal line 10 and/or the high coil signal line 46 in order to provide signals clearly delineating the firing time and the dwell period of the ignition system under test. In the aforementioned copending applications, such signal conditioning circuitry is disclosed and claimed as will provide a conditioned coil output signal on line 37 which delineates the firing and dwell times of the ignition system, whether the ignition system is defeated or not, and whether the ignition system be a conventional breaker point system or a modern electronic system, positively switched (as in FIG. 1) or negatively switched, with a poor battery while cranking, or while operating with high battery voltage.

Figure 2:
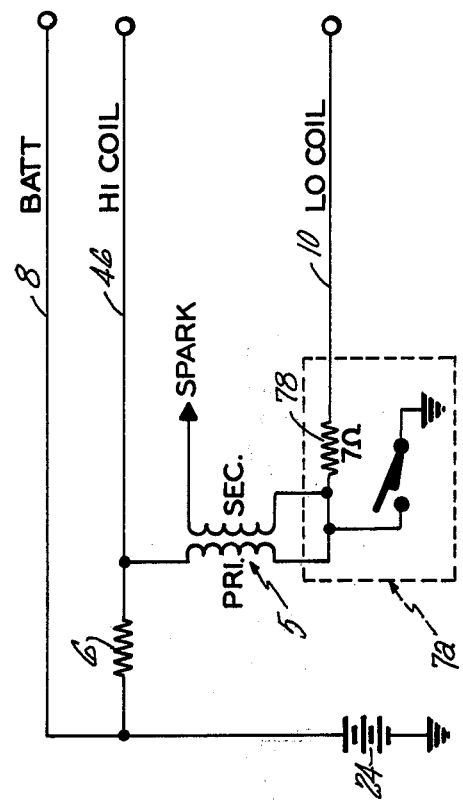
FIG. 2 is a simplified schematic diagram of a modern ignition system having a series protection resistor in the low coil signal line, in accordance with the art.

Referring to FIG. 2, a problem arises in modern electronic ignition systems of some types in which the electronic switching means 7a may include a protective resistance 78 in series with the low coil line 10 to prevent external connections from causing damage to the switching means 7a. If one were to connect the ignition defeat circuit 70 of FIG. 1 to the ignition system of FIG. 2, the total resistance in series with the primary would be twelve ohms in the examples shown, which would permit close to a hundred volts across the primary, approaching tens of kilovolts in the secondary, which can create sufficient spark for sporadic firing of the spark plugs, and/or full ignition, depending upon the particular engine under test. Ignition defeat could be properly provided to an ignition system of the type shown in FIG. 2 if the high coil could be shorted to the low coil line during the firing time; the seven ohm protective resistor within the switching means 7a would provide an adequate ignition defeat impedance (if of suitable current-carrying capacity). However, if the short circuit ignition defeat were also used for systems of the type shown in FIG. 1, the primary would be totally shorted out and would never have a current buildup during the dwell period, and therefore, the ignition system would not function at all during ignition defeat. It is therefore apparent that the same sort of ignition defeat system is not useful for both the type of ignition system illustrated in FIG. 1 and the type of ignition system illustrated in FIG. 2.

Another consideration illustrated in FIG. 1 is that, even with the ignition defeat in operation, the defeat resistance 74 still provides sufficient signals so that the signal conditioning circuitry 76 can monitor the conditions in the ignition system so as to provide a conditioned coil output signal 37, delineating the firing time and the dwell period of the ignition system under test. And, any ignition defeat system which is to satisfy the needs of the systems of FIGS. 1 and 2 must inherently provide for adequate sensing of the dwell and firing time, or else there will be less purpose to having ignition defeat, since no monitoring of the ignition system will be possible during defeated cranking.

Figure 3:
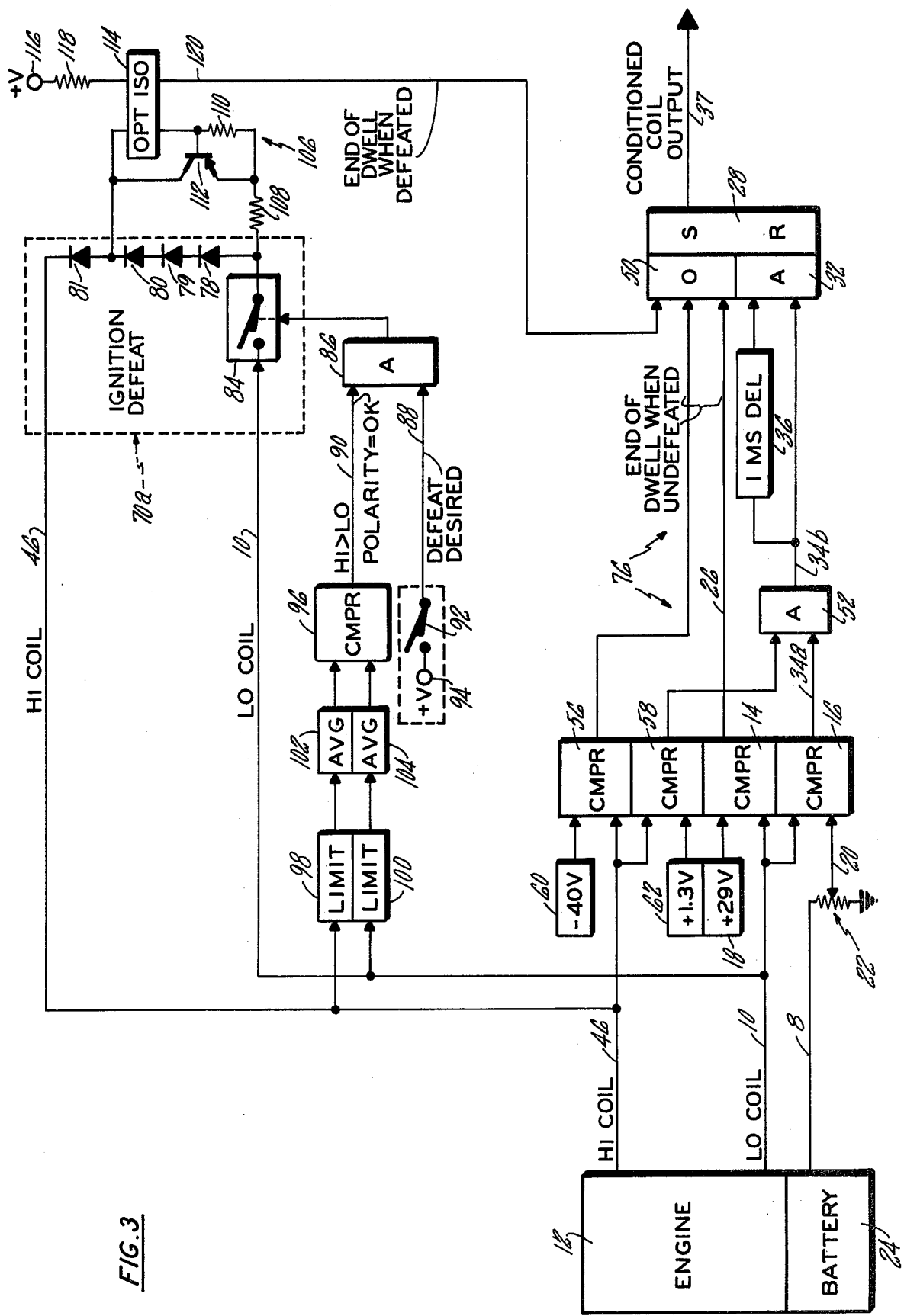
FIG. 3 is a schematic block diagram of the present invention as associated with signal conditioning circuitry of the aforementioned copending applications.

The ignition defeat and dwell sensing in accordance with the present invention is illustrated in FIG. 3 in conjunction with the signal conditioning circuit 76 of the type disclosed and claimed in the aforementioned copending applications, connected to an engine 12 and its battery 24, in the manner shown in FIGS. 1 and 2. This signal conditioning circuitry 76, shown at the bottom of FIG. 3, includes a compare circuit 14 that senses the high voltage swing at the end of the dwell period (beginning of the firing time) in a negatively switched ignition system (of the type shown in FIG. 1), by comparison of the low coil signal 10 with a positive reference voltage from a source 18 (such as +29 volts); a compare circuit 16 which senses the beginning of dwell period in a negatively switched system (as seen in FIG. 1), by sensing when the low coil signal on the line 10 drops below some significant fraction (such as 9/10) of battery voltage on the line 8; a compare circuit 56 which senses the end of the dwell period in a positively switched ignition system, by comparing the signal on the high coil line 54 with a negative reference voltage source 60 (such as −40 volts); and a compare circuit 58 for sensing the beginning of the dwell period in a positively switched ignition system by comparing the high coil voltage 54 with a small positive reference voltage source 62 (such as +1.3 volts). Either of the compare circuits 56, 14 will sense the end of the dwell period by sensing the high voltage swing, respectively, across the primary in an ignition system of the type shown in FIG. 1, or a similar type in which the high end of the coil primary is switched rather than the low end, with or without ignition defeat of the type shown in FIG. 1. Either of these compare circuits 56, 14 will operate an OR circuit 50 so as to set a bistable device 28, the output of which comprises the conditioned coil output on a line 37. The compare circuits 16, 58 operate an AND circuit 52 so as to provide a signal on a line 34b that conditions an AND circuit 32 and starts a one millisecond delay circuit 36 (that prevents false operation as a consequence of the ringing voltage during firing time), that will cause the AND circuit 32 to reset the bistable device 28, thus causing a loss of the conditioned output signal on the line 37 during the dwell period. Handling of the one millisecond delay is described more fully in the aforementioned application of Back et al. When operating with a negatively switched system (of the type shown in FIG. 1), the high coil signal is essentially at battery voltage all of the time, so the compare circuit 58 will enable the AND circuit 52 all the time; this leaves control of the AND circuit 52 in command of the signal on line 34a from the compare circuit 16. On the other hand, if a positively switched system is being operated, the low coil signal on the line 10 is always less than a significant fraction of the battery voltage, so that the compare circuit 16 always provides a signal on line 34a to enable the AND circuit 52; this leaves the AND circuit 52 operable in dependence upon the presence or absence of the signal from the compare circuit 58. Thus, compatibility of the AND circuit 52 to the two systems is established. Similarly, in a negatively switched system of the type shown in FIG. 1, the high coil signal is always positive, so the compare circuit 56 never operates; and in a positively switched ignition system, the low coil signal is always at ground so that the compare circuit 14 never operates; therefore, the two compare circuits 14, 56 never interfere with each other, only one at a time being capable of operating the OR circuit 50. All of this is as set forth in the aforementioned application of Van Vessem, et al.

An exemplary embodiment of the ignition defeat system of the present invention is shown in simplified schematic block form at the top of FIG. 3. Ignition defeat per se is performed by an ignition defeat circuit 70a which includes a unilateral impedance, such as a plurality of diodes 78-81, poled to conduct from low coil to high coil, thus capable of carrying significant current with low voltage drop during the firing time (when the switch means 7, FIG. 1, is open) but providing very high reverse impedance, to thereby avoid shorting of the primary, during the dwell period when the switch means 7 (FIG. 1) is closed. Ignition defeat is brought into play by connecting the diodes 78-81 between the low coil signal line 10 and the high coil signal line 46 by means of a suitable switch 84, which may preferably comprise an electronic switch means such as a pair of back-to-back power transistors which are operable only when ignition defeat is desired and when it has been determined that the circuitry has been connected properly to the ignition system under test (with the high coil signal line 46 connected to the high end of the coil and the low coil signal line 10 connected to the low end of the coil). This is determined by an AND circuit 86 in response to a defeat desired signal on a line 88 concurrently with a polarity=OK signal on a line 90. The defeat desired signal on the line 88 can be generated in any suitable fashion, as by a manually operated switch 92 connected to a suitable source of voltage 94, or by any other signal, such as one produced by a suitably programmed computer utilized in a diagnostic system including the ignition defeat and signal conditioning disclosed herein. The polarity=OK signal on the line 90 is provided by a compare circuit 96 which compares the average of a limited version of the high coil signal on the line 46 with the average of a limited version of the low coil signal on the line 10. This is achieved by first passing the respective signals through corresponding limit circuits 98, 100, each of which may comprise a suitable zener diode (such as a 1N3024 B), which has its cathode connected to the corresponding line 10, 46, and its anode connected to ground; this limits the reverse voltage to on the order of fifteen volts so that the signals can be no greater than fifteen volts above ground; and in the forward direction, breakdown (as in all diodes) with fractional voltage (such as 0.7 volt) will limit the negative excursions. Normally, the high coil signal should generally be more positive than the low coil signal, even while the ignition system is in operation, with or without defeat. The voltage excursions are limited by the limit circuits 98, 100 so as to eliminate the high voltage spikes from inclusion in the averages, and to protect the remaining circuitry therefrom. The outputs of the limit circuits 98, 100 are provided to respective averaging circuits 102, 104 which may simply comprise series resistors and parallel capacitors (similar to low pass filters or integrators); if the circuitry is connected properly in a negative ground system, the output of the averaging circuit 102 will always be more positive than the output of the averaging circuit 104, indicating that the high coil signal line 46 and low coil signal line 10 are properly connected to the battery end and the ground end, respectively, of the coil primary. In such case, the compare circuit 96 will provide the signal on the line 90 so that whenever defeat is desired, the AND circuit 86 can respond to a signal indicative thereof on the line 88, to operate the switch 84 and connect the diodes 78-81 in parallel across the primary.

Associated with the ignition defeat circuit 70a there is a sensing circuit 106 which includes a current limiting resistor 108, a current sensing resistor 110, a shorting transistor 112, and an optical isolator 114. The voltage across the primary is, when the switch 84 is closed, reflected across the diodes 78-81; even though the forward impedance of these diodes is relatively small, the high voltage swing on the low coil line (which is positive with respect to the high coil line 46) will cause on the order of seven or eight amps to flow through the diodes 78-81, the fractional ohmage thereof developing sufficient voltage to be sensed by the sensing circuit 106. The optical isolator 114 may be of any known type, such as a Texas Instruments TIL 103; this type of isolator includes a current responsive photo-emitter optically coupled to a photo-electric sensor which acts as a switch. This will connect a suitable source of voltage 116 through a resistor 118 to a signal line 120 that is connected to the OR circuit 50 and allows setting the bistable device 28 at the end of dwell as the optical isolator 114 senses current resulting from opening of the switch means 7 (FIG. 1) at the start of firing time. The resistor 110 senses the current flow through the optical isolator 114, and when it approaches the limit which is permissible through the optical isolator 114, the voltage thereacross will bias the transistor 112 to cause it to conduct, to shunt current away from the optical isolator to prevent damage thereto. Current through the transistor is limited by the resistor 108. The diodes 78–80 are used in sufficient numbers so as to provide, when conducting, a sufficient voltage drop for adequate sensing of the end of dwell period by the sensing circuitry 106. The diode 81 is used to protect the sensing circuit 106 (particularly the optical isolator 114) from positive voltage on the high coil signal line 46 when the low coil signal line 10 is grounded during the dwell period by the switch means 7 (FIG. 1). All of these diodes may be of any suitable type capable of handling sufficient current, such as 1N5550 diodes.

Operation of the ignition defeat and defeated ignition end of dwell sensing shown at the top of FIG. 3, when connected to a negatively switched system of the type either as shown in FIG. 1 or FIG. 2 (that is with or without a series resistor in the low coil line 10) simply provides high reverse impedance during the dwell period, and very low forward impedance during ringing time. When connected to positively switched systems, in which the high coil signal line may go to several hundred volts negative with respect to ground or the low coil signal line 10, there is substantially no high voltage buildup with the switch 84 closed because the diodes 78–81 substantially short circuit the coil primary, thus defeating ignition; and the operation is the same as in the case of the negatively switched systems; in other words, regardless of whether the high coil goes highly negative with respect to low coil or whether the low coil goes highly positive with respect to high coil, the operation is the same; the difference is whether the signal lines are highly positive and negative with respect to ground. This is rendered immaterial due to the fact that the sensing circuitry 106 utilizes the optical isolator so that the ignition defeat circuit can float wherever it must. It is to be noted that with the switch 84 open, the ignition defeat circuitry 78 does nothing, and the sensing circuitry 106 has nothing to sense. In such a case, the signal conditioning circuitry 76 of the type described in the aforementioned application of Van Vessem et al provides all of the functions for sensing the operation of the ignition system. With the switch 84 closed so that the ignition defeat circuitry 70a is operative, the compare circuits 14 and 56 are incompetent to sense the end of the dwell period since there are no high voltage swings; but in that case the sensing circuitry 106 operates as described hereinbefore to sense the end of dwell period. And, even with the ignition defeat circuitry 70a operative, the compare circuits 16, 58 sense the beginning of the dwell period as described briefly hereinbefore and more fully in the aforementioned application of Van Vessem, et al. Taken all together, the circuitry disclosed in FIG. 3 will accommodate ignition systems which are negatively switched or positively switched; which use conventional cam-actuated breaker points shunted with capacitors or modern electronic solid state switching; which include resistors in series with the low coil or high coil signal line, or not; while such systems are operating, or under ignition defeat; and while such systems are operating with relatively high battery voltage or even with weak batteries while slowly cranking.

The switch 84 is seen in FIG. 3 to be placed in the low coil signal line 10; it will be equally effective if placed in the high coil signal line 46 instead. The switch 84 is not disclosed in detail therein since any suitable switch may be utilized; however, as described hereinbefore, it is preferable to provide back-to-back switching transistors such that the reverse biases thereacross will not be damaging as a consequence of high positive or negative voltages on the high coil signal line 46 or the low coil signal line 10 during undefeated operation; and, preferably, such switching should be operated in an isolated fashion (such as with a signal transformer between the AND circuit 86 and the switching elements represented by the switch 84). The diodes 78–81 could be replaced by other suitable devices, such as transistors, to provide unilaterally conductive impedance. The ignition defeat circuitry 70a disclosed herein may be used, if desired, with other forms of detection circuitry, including other forms of detecting the end of dwell period when defeated, and other forms of detecting signals in the ignition system when not defeated. Similarly, if not felt to be desirable in any particular implementation of the present invention, the polarity detection provided by the circuitry 96–104 need not be utilized; but it is preferable to ensure that correct polarity is provided in order to avoid damaging any of the sensing circuitry 106 which may be utilized with the present invention, since the protection of the diode 81 would be unavailable if connected in a reversed fashion. Although the exemplary embodiment herein is configured to work with a negative ground ignition system, by obvious adjustments to polarity, it could readily work with positive ground ignition systems. Similarly, although the invention has been shown and described with respect to an exemplary embodiment thereof, it should be understood by those skilled in the art that the foregoing and various other changes, omissions and additions in the form and detail thereof may be made therein and thereto, without departing from the spirit and the scope of the invention.

Having thus described typical embodiments of our invention, that which we claim as new and desire to secure by Letters Patent is:

1. An ignition defeat circuit for a spark ignition engine comprising a series combination including a selectively operable switch means in series with a unilaterally conductive impedance means, said series combination being adapted for connection between the high coil connection and the low coil connection of the spark ignition under test, said unilaterally conductive impedance means being poled to conduct current flowing from the primary of the ignition coil during firing time and to block current from the battery during dwell time.

2. Apparatus for selectively defeating the ignition of a spark ignition engine having an ignition cycle including alternate dwell period portion and firing time portion during diagnosis of the ignition system thereof, comprising:

a high coil signal line adapted to be connected to the battery side of the primary of the ignition coil of the engine to be tested;

a low coil signal line adapted to be connected to the ground side of the primary of the ignition coil of the engine to be tested;

a selectively operable switch means and a unilaterally conductive impedance connected in series with each other between said high coil signal line and said low coil signal line, said unilaterally conductive impedance poled to block current induced by the battery during the dwell period of the ignition cycle in which current is built up in the primary of the coil and poled to conduct current of the primary coil during firing time of the ignition cycle; and means for selectively operating said switch means.

3. Apparatus according to claim 2 wherein said means for operating said switch means includes means for determining the polarity of nominal voltage between said high coil signal line and said low coil signal line and enabling said switch means to be closed only in response to the polarity indicating that the high coil signal line is properly connected to the high coil and the low coil signal line is properly connected to the low coil.

4. Apparatus according to claim 3 wherein said polarity determining means comprises means for comparing the nominal voltage between said high coil signal line and ground with the average voltage between said low coil signal line and ground.

5. Apparatus according to claim 4 wherein said polarity determining means comprises a pair of limit means, each respectively associated with said high coil signal line and said low coil signal line, each for limiting the voltage excursions of the related one of said signal lines;

a pair of voltage averaging means, one respectively corresponding and connected to the output of each of said limit means, each for providing an indication of the average voltage between the corresponding one of said limit means and ground; and compare means connected to the output of each of said averaging means so that said compare means compares the outputs of the averaging circuits with one another to provide a signal indication of the relative polarity thereof.

6. Apparatus according to claim 2 wherein said unilaterally conductive impedance comprises a first unilaterally conductive impedance portion in series with a second unilaterally conductive impedance portion; and further comprising:

current sensing means connected across said first unilaterally conductive impedance portion for sensing the presence of current therein, said second unilaterally conductive impedance portion providing isolation of said current sensing means from voltages in said ignition system during the dwell period, said current sensing means providing, with said high coil signal line and said low coil signal line connected to an ignition system and said switch means closed to provide ignition defeat, an end of dwell signal in response to current flow through said first unilaterally conductive impedance portion.

7. Apparatus according to claim 6 additionally comprising:

end of dwell means connected to said high coil signal line and to said low coil signal line for sensing the end of the dwell period when ignition is not defeated;

bistable means settable into either one of two stable states, said bistable means when set in the first one of said states, providing an output signal related in time to the firing time of the ignition system under test, said bistable means alternatively responsive to said current sensing means and to said end of dwell means to be set into said first state in response to signals from either of them; and means connected to said high coil signal line and to said low coil signal line for sensing the beginning of the dwell period with the ignition defeated and with the ignition not defeated, said means providing a signal at the beginning of the dwell period for resetting said bistable device in timed relationship therewith.

* * * * *